(12) United States Patent
Yeh et al.

(10) Patent No.: US 12,557,678 B2
(45) Date of Patent: Feb. 17, 2026

(54) WIRELESS TRANSISTOR OUTLINE PACKAGE STRUCTURE

(71) Applicant: TONG HSING ELECTRONIC INDUSTRIES, LTD., Taipei (TW)

(72) Inventors: Hung-Hsiang Yeh, Taipei (TW); Jia-Yi Wu, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 407 days.

(21) Appl. No.: 18/372,742

(22) Filed: Sep. 26, 2023

(65) Prior Publication Data

US 2025/0029881 A1    Jan. 23, 2025

(30) Foreign Application Priority Data

Jul. 17, 2023   (TW) .................................. 112126475

(51) Int. Cl.
| | |
|---|---|
| *H01L 23/15* | (2006.01) |
| *H01L 23/00* | (2006.01) |
| *H01L 23/31* | (2006.01) |
| *H01L 23/36* | (2006.01) |
| *H01L 23/498* | (2006.01) |

(52) U.S. Cl.
CPC .......... *H01L 23/15* (2013.01); *H01L 23/3121* (2013.01); *H01L 23/36* (2013.01); *H01L 23/49805* (2013.01); *H01L 23/49811* (2013.01); *H01L 23/49833* (2013.01); *H01L 24/08* (2013.01); *H01L 24/32* (2013.01); *H01L 2224/08258* (2013.01); *H01L 2224/32112* (2013.01)

(58) Field of Classification Search
CPC .............. H01L 23/49861; H01L 23/15; H01L 23/3121; H01L 24/16; H01L 24/32
See application file for complete search history.

(56) References Cited

U.S. PATENT DOCUMENTS

| | | | |
|---|---|---|---|
| 10,566,295 B2 | 2/2020 | Sakakibara | |
| 2019/0088577 A1* | 3/2019 | Shimoyama | ............ H01L 24/32 |
| 2022/0199502 A1 | 6/2022 | Prajuckamol et al. | |
| 2024/0088007 A1* | 3/2024 | Baek | ................. H01L 23/49531 |

* cited by examiner

*Primary Examiner* — Steven B Gauthier
*Assistant Examiner* — Marc-Anthony Armand
(74) *Attorney, Agent, or Firm* — Li & Cai Intellectual Property (USA) Office

(57) ABSTRACT

A wireless transistor outline (TO) package structure includes a carrying module, a chip and a lead frame both mounted on the carrying module, a sheet-like bonding module mounted on the chip and the lead frame in a flip chip manner, and an encapsulant that covers the above components therein. A connection pad of the chip and a connection segment of the lead frame are coplanar with each other. The sheet-like bonding module includes a ceramic substrate and a plurality of circuit layers that are stacked and formed on the ceramic substrate in a direct plated copper (DPC) manner. Areas of the circuit layers gradually decrease in a direction away from the ceramic substrate, and thicknesses of the circuit layers gradually increase in the same direction. The circuit layer arranged away from the ceramic substrate connects the connection pad and the connection segment for establishing an electrical connection therebetween.

15 Claims, 10 Drawing Sheets

WIRELESS TRANSISTOR OUTLINE PACKAGE STRUCTURE

CROSS-REFERENCE TO RELATED PATENT APPLICATION

This application claims the benefit of priority to Taiwan Patent Application No. 112126475, filed on Jul. 17, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a wireless transistor outline (TO) package structure.

BACKGROUND OF THE DISCLOSURE

A conventional transistor outline (TO) package structure includes a carrier, a chip and a lead frame that are both mounted on the carrier, and metal wires that are electrically couple the chip and the lead frame in a wire-bonding manner. The metal wires in the conventional TO package structure are easily broken, such that the performance (e.g., the heat-dissipation efficiency) and the reliability of the conventional TO package structure are difficult to be increased.

SUMMARY OF THE DISCLOSURE

In response to the above-referenced technical inadequacies, the present disclosure provides a wireless transistor outline (TO) package structure for effectively improving on the issues associated with conventional TO package structures.

In order to solve the above-mentioned problems, one of the technical aspects adopted by the present disclosure is to provide a wireless transistor outline (TO) package structure, which includes a carrying module, a chip, at least one lead frame, a sheet-like bonding module, and an encapsulant. The carrying module includes a ceramic board and a plurality of inside metal layers. The ceramic board has an inner board surface and an outer board surface that is opposite to the inner board surface. The inside metal layers are stacked on the inner board surface of the ceramic board. The inside metal layers include a first inside metal layer formed on the inner board surface of the ceramic board in a direct plated copper (DPC) manner and a second inside metal layer that is arranged away from the ceramic board. Moreover, areas of the inside metal layers gradually decrease in a first direction away from the ceramic board, and thicknesses of the inside metal layers gradually increase in the first direction away from the ceramic board. The chip is mounted on the second inside metal layer and has a connection pad that is arranged away from the carrying module. The at least one lead frame has a first connection segment, a second connection segment, and a pin segment. The first connection segment is mounted on and electrically coupled to the second inside metal layer. The second connection segment is spaced apart from the first connection segment and is coplanar with the connection pad of the chip. The pin segment extends from the second connection segment. The sheet-like bonding module is mounted on the chip and the at least one lead frame in a flip chip manner. The sheet-like bonding module includes a ceramic substrate and a plurality of circuit layers. The ceramic substrate has a first surface and a second surface that is opposite to the first surface. The circuit layers are stacked on the first surface of the ceramic substrate. The circuit layers include a first circuit layer formed on the first surface of the ceramic substrate in the DPC manner and a second circuit layer that is arranged away from the ceramic substrate. The second circuit layer is connected to the connection pad and the second connection segment so as to electrically couple the chip and the at least one lead frame. Moreover, areas of the circuit layers gradually decrease in a second direction away from the ceramic substrate, and thicknesses of the circuit layers gradually increase in the second direction away from the ceramic substrate. The encapsulant encapsulates at least part of the carrying module, the chip, the first connection segment and the second connection segment of the at least one lead frame, and at least part of the sheet-like bonding module. The pin segment of the at least one lead frame passes through and is exposed from the encapsulant.

In order to solve the above-mentioned problems, another one of the technical aspects adopted by the present disclosure is to provide a wireless transistor outline (TO) package structure, which includes a carrying module, a chip, at least one lead frame, a sheet-like bonding module, and an encapsulant. The carrying module includes a ceramic board and a plurality of inside metal layers. The ceramic board has an inner board surface and an outer board surface that is opposite to the inner board surface. The inside metal layers are stacked on the inner board surface of the ceramic board. The inside metal layers include a first inside metal layer formed on the inner board surface of the ceramic board in a direct plated copper (DPC) manner, a second inside metal layer arranged away from the ceramic board, and at least one third inside metal layer that is sandwiched between the first inside metal layer and the second inside metal layer. Moreover, areas of the inside metal layers gradually decrease in a first direction away from the ceramic board, and thicknesses of the inside metal layers gradually increase in the first direction away from the ceramic board. The chip is mounted on one of the inside metal layers and has a connection pad that is arranged away from the carrying module. The at least one lead frame has a first connection segment, a second connection segment, and a pin segment. The first connection segment is mounted on and electrically coupled to another one of the inside metal layers. The second connection segment is spaced apart from the first connection segment and is coplanar with the connection pad of the chip. The pin segment extends from the second connection segment. The sheet-like bonding module is mounted on the chip and the at least one lead frame in a flip chip manner. The sheet-like bonding module includes a ceramic substrate and a plurality of circuit layers. The ceramic substrate has a first surface and a second surface that is opposite to the first surface. The circuit layers are tacked on the first surface of the ceramic substrate. The circuit layers include a first circuit layer formed on the first surface of the ceramic substrate in the DPC manner, a second circuit layer arranged away from the ceramic substrate, and at least one third circuit layer that is sandwiched between the first circuit layer and the second circuit layer. The connection pad and the second connection segment are connected to one of the circuit layers so as to electrically couple the chip and the at least one lead frame. Moreover, areas of the circuit layers gradually decrease in a second direction away from the ceramic substrate, and thicknesses of the circuit layers gradually increase in the second direction away from the ceramic substrate. The encapsulant encapsulates at least part of the carrying module, the chip, the first connection segment and the second connection segment of the at least one lead frame, and at least part of the sheet-like bonding module. The pin segment of the at least one lead frame passes through and is exposed from the encapsulant.

Therefore, in the wireless TO package structure provided by the present disclosure, the second connection segment and the connection pad disposed on the carrying module are coplanar with each other so as to enable the sheet-like bonding module to replace a conventional wire-bonding process, thereby effectively increasing the performance (e.g., the heat-dissipation efficiency) and the reliability of the wireless TO package structure.

Moreover, each of the carrying module and the sheet-like bonding module is provided in a DPC configuration, and the inside metal layers and the circuit layers are provided in a specific stacked configuration, thereby effectively preventing a delamination issue and a warpage issue from being generated and facilitating the mass production of the wireless TO package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
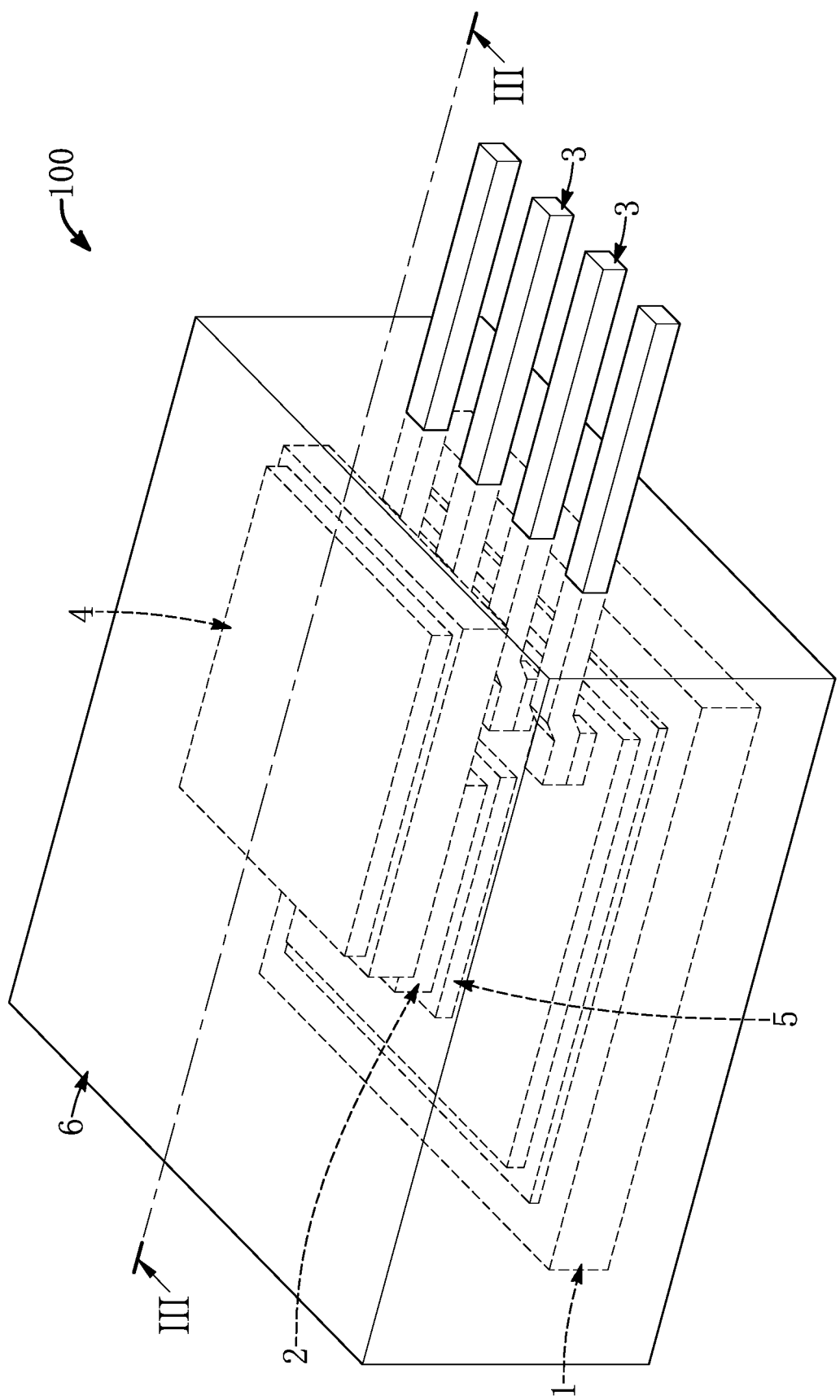
FIG. 1 is a schematic perspective view of a wireless transistor outline (TO) package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
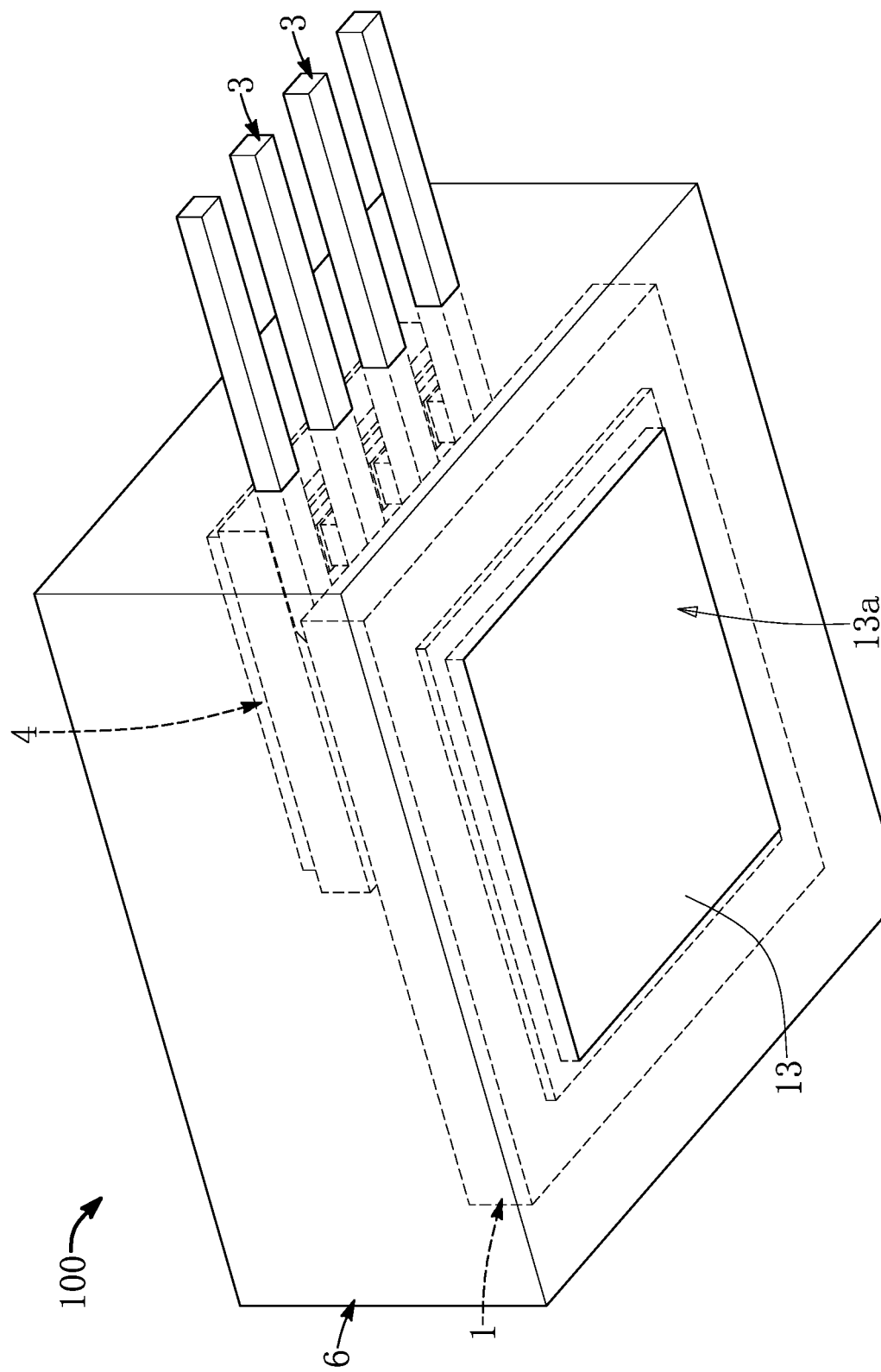
FIG. 2 is a schematic perspective view of the wireless TO package structure of FIG. 1 from another angle of view.
Figure 3:
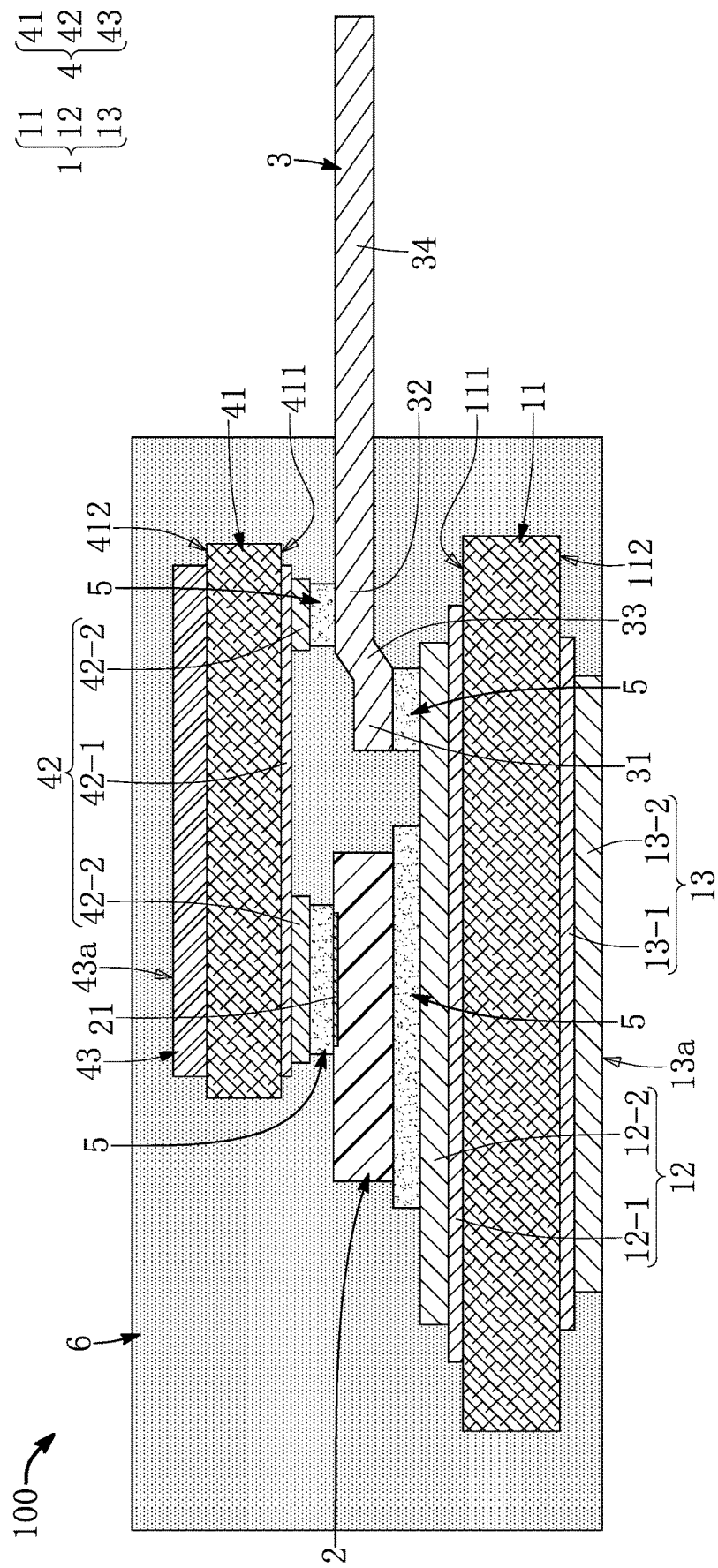
FIG. 3 is a schematic cross-sectional view taken along line III-III of FIG. 1.

Referring to FIG. 1 to FIG. 5, a first embodiment of the present disclosure is provided. As shown in FIG. 1 to FIG. 3, the present embodiment provides a wireless transistor outline (TO) package structure 100, which means the wireless TO package structure 100 is formed without any wires embedded therein. The wireless TO package structure 100 includes a carrying module 1, a chip 2 mounted on the carrying module 1, a plurality of lead frames 3 mounted on the carrying module 1, a sheet-like bonding module 4 mounted on the chip 2 and the lead frames 3 in a flip chip manner, a plurality of connection bodies 5 each connected to any two of the above components, and an encapsulant 6, but the present disclosure is not limited thereto. For example, in other embodiments of the present disclosure not shown in the drawings, a quantity of the lead frames 3 can be at least one, or the connection bodies 5 can be omitted or replaced with other components.

The carrying module 1 includes a ceramic board 11, a plurality of inside metal layers 12 formed on one side of the ceramic board 11, and a plurality of outside metal layers 13 that are formed on another side of the ceramic board 11. The ceramic board 11 has an inner board surface 111 and an outer board surface 112 that is opposite to the inner board surface 111 and that is preferably parallel to the inner board surface 111, but the present disclosure is not limited thereto.

Moreover, the inside metal layers 12 are stacked on the inner board surface 111 of the ceramic board 11, areas of the inside metal layers 12 gradually decrease in a first direction (e.g., an upward direction shown in FIG. 3) away from the ceramic board 11, and thicknesses of the inside metal layers 12 gradually increase in the first direction away from the ceramic board 11.

Specifically, the inside metal layers 12 include a first inside metal layer 12-1 formed on the inner board surface 111 of the ceramic board 11 in a direct plated copper (DPC) manner and a second inside metal layer 12-2 that is arranged away from the ceramic board 11. The area of the first inside metal layer 12-1 is a largest one in the areas of the inside metal layers 12, and the area of the second inside metal layer 12-2 is a smallest one in the areas of the inside metal layers 12. The thickness of the first inside metal layer 12-1 is a smallest one in the thicknesses of the inside metal layers 12, and the thickness of the second inside metal layer 12-2 is a largest one in the thicknesses of the inside metal layers 12.

In addition, the outside metal layers 13 are stacked on the outer board surface 112 of the ceramic board 11, areas of the outside metal layers 13 gradually decrease in a second direction (e.g., a downward direction shown in FIG. 3) away from the ceramic board 11, and thicknesses of the outside metal layers 13 gradually increase in the second direction away from the ceramic board 11.

Specifically, the outside metal layers 13 include a first outside metal layer 13-1 formed on the outer board surface 112 of the ceramic board 11 in the DPC manner and a second outside metal layer 13-2 that is arranged away from the ceramic board 11. The area of the first outside metal layer 13-1 is a largest one in the areas of the outside metal layers 13, and the area of the second outside metal layer 13-2 is a smallest one in the areas of the outside metal layers 13. The thickness of the first outside metal layer 13-1 is a smallest one in the thicknesses of the outside metal layers 13, and the thickness of the second outside metal layer 13-2 is a largest one in the thicknesses of the outside metal layers 13.

Figure 4:
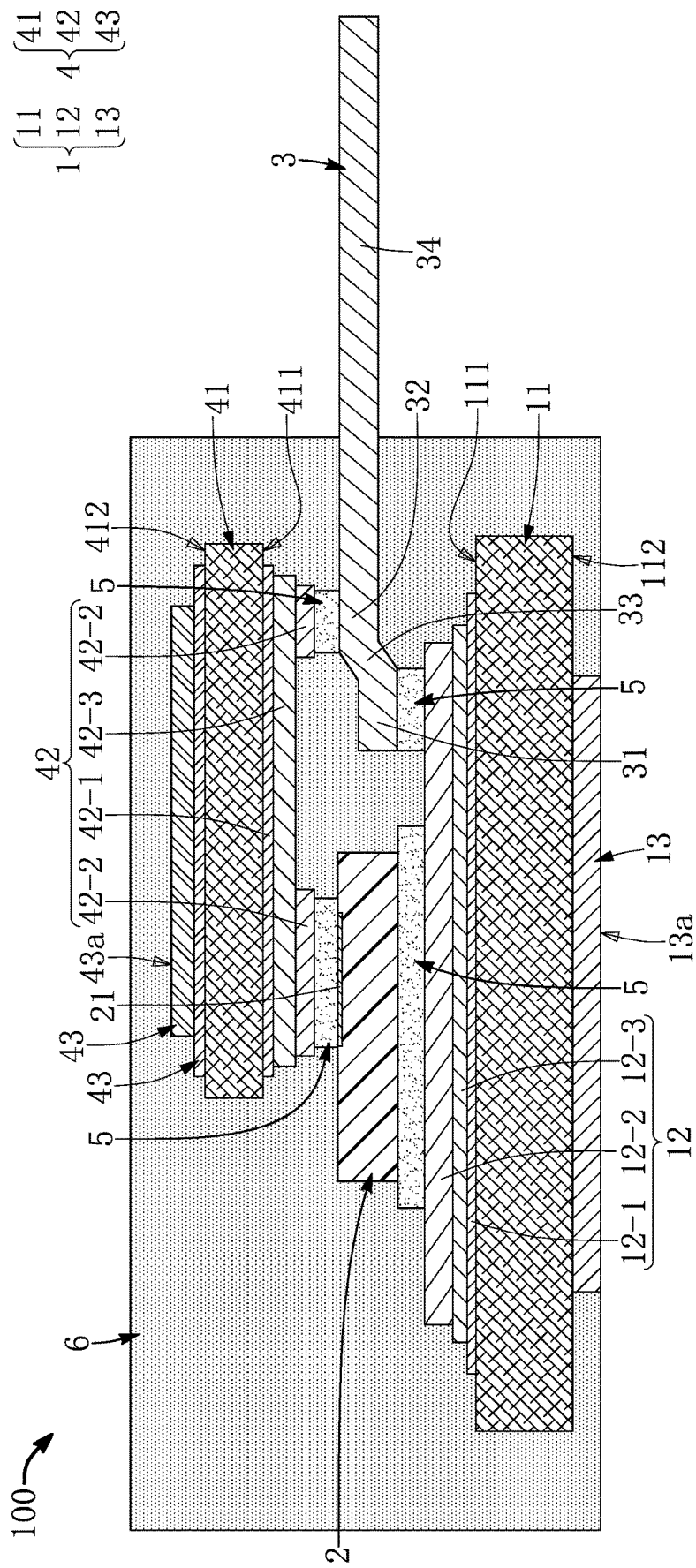
FIG. 4 is a schematic cross-sectional view showing the wireless TO package structure of FIG. 3 in another configuration.
Figure 5:
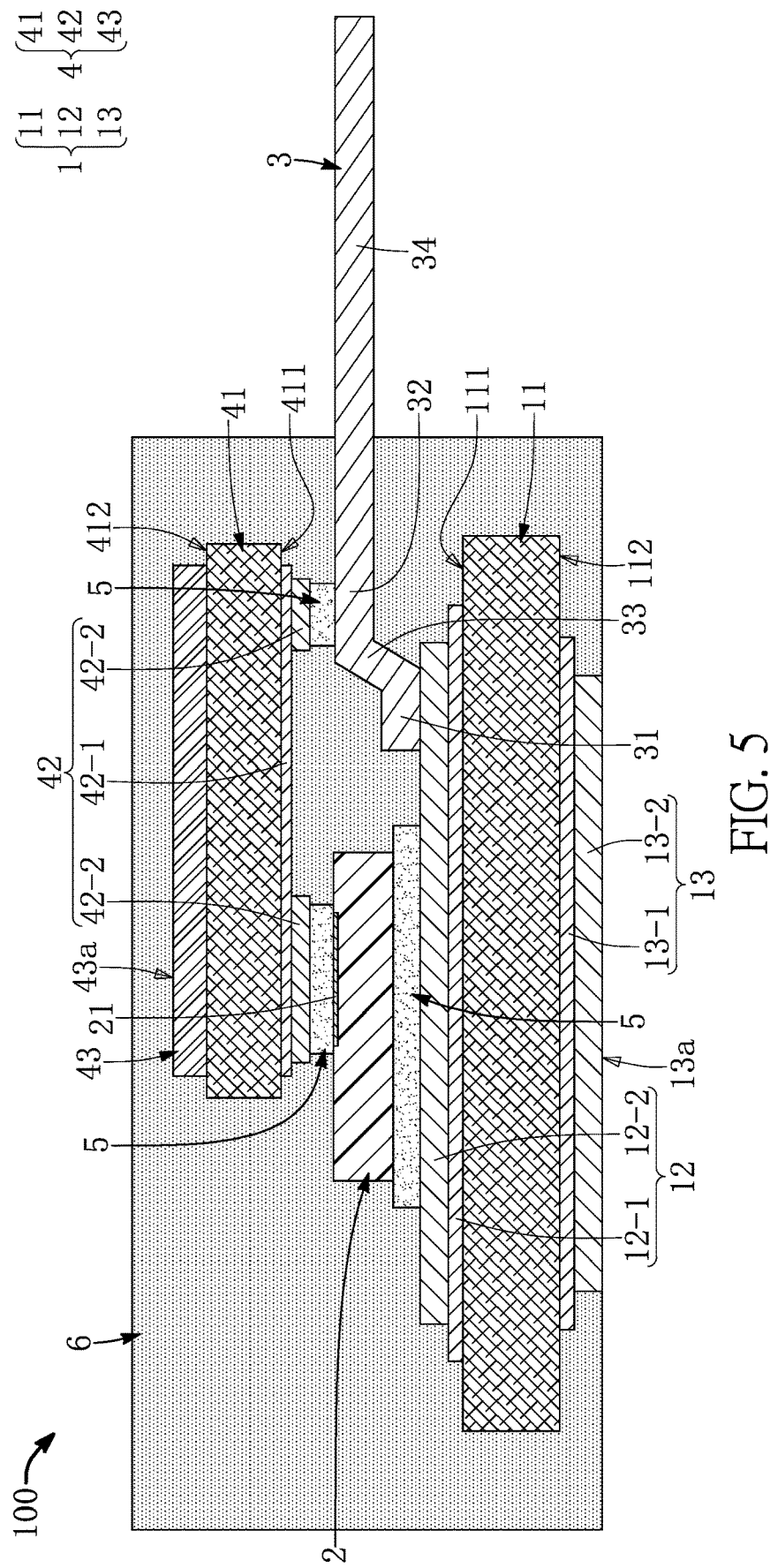
FIG. 5 is a schematic cross-sectional view showing the wireless TO package structure of FIG. 3 in yet another configuration.

It should be noted that, as shown in FIG. 3, a quantity of the inside metal layers 12 and a quantity of the outside metal layers 13 can each be two, but the present disclosure is not limited thereto. For example, as shown in FIG. 4, the inside metal layers 12 include at least one third inside metal layer 12-3 sandwiched between the first inside metal layer 12-1 and the second inside metal layer 12-2, a quantity of the outside metal layers 13 can be one, and the outside metal layer 13 is formed on the outer board surface 112 of the ceramic board 11 in the DPC manner. Or, in other embodiments of the present disclosure not shown in the drawings, the carrying module 1 can be provided without the outside metal layers 13.

As shown in FIG. 1 to FIG. 3, the chip 2 is mounted on the second inside metal layer 12-2 of the carrying module 1, and the chip 2 and the second inside metal layer 12-2 in the present embodiment are connected and fixed to each other through one of the connection bodies 5. The chip 2 has a connection pad 21 arranged away from the carrying module 1, and the chip 2 and the second inside metal layer 12-2 are not electrically coupled to each other through the corresponding connection body 5. In other words, the chip 2 is electrically coupled to other components through the connection pad 21. Moreover, each of the connection bodies 5 in the present embodiment can be a solder, a conductive paste, a sinter silver, or a solder preform, but the present disclosure is not limited thereto.

As the lead frames 3 in the present embodiment are of substantially the same structure and have the same connection relationship, the following description discloses the structure of just one of the lead frames 3 for the sake of brevity, but the present disclosure is not limited thereto. For example, in other embodiments of the present disclosure not shown in the drawings, the lead frames 3 can be of different structures or can have different connection relationships.

The lead frame 3 in the present embodiment is integrally formed as a single one-piece structure having an elongated shape. The lead frame 3 has a first connection segment 31, a second connection segment 32 spaced apart from the first connection segment 31, a bending segment 33 slantingly connecting the first connection segment 31 and the second connection segment 32, and a pin segment 34 that extends from the second connection segment 32 in a direction away from the first connection segment 31, but the present disclosure is not limited thereto.

Specifically, the first connection segment 31 is arranged on one end of the lead frame 3, and the first connection segment 31 is mounted on and electrically coupled to the second inside metal layer 12-2. In the present embodiment, the first connection segment 31 and the second inside metal layer 12-2 are connected and fixed to each other through one of the connection bodies 5, but the present disclosure is not limited thereto. For example, in other embodiments of the present disclosure not shown in the drawings, the first connection segment 31 of the lead frame 3 can be directly connected to the second inside metal layer 12-2 in an ultrasonic welding manner.

As shown in FIG. 1 to FIG. 3, the lead frame 3 in the present embodiment can be provided with the bending segment 33 due to the thickness of the chip 2, thereby enabling the second connection segment 32 to be coplanar with the connection pad 21 of the chip 2. In other words, since the lead frame 3 is formed with the bending segment 33, a height of the second connection segment 32 with respect to the inner board surface 111 is greater than a height of the first connection segment 31 with respect to the inner board surface 111.

Accordingly, the bending segment 33 of the lead frame 3 can be formed with different bending angles according to the thickness of the chip 2, thereby maintaining (a top side of) the second connection segment 32 to be coplanar with (a top side of) the connection pad 21 of the chip 2 and providing an enough supporting force to the second connection segment 32 through the bending segment 33, but the present disclosure is not limited thereto. For example, in other embodiments of the present disclosure not shown in the drawings, the lead frame 3 can be provided without the bending segment 33, and the first connection segment 31 and the second connection segment 32 are coplanar with each other.

In addition, the pin segment 34 of the present embodiment extends from the second connection segment 32 in a straight direction, but the pin segment 34 in other embodiments of the present disclosure not shown in the drawings can be bent relative to the second connection segment 32 according to design requirements (e.g., a portion of the pin segment 34 exposed from the encapsulant 6 being bent at 90 degrees).

The sheet-like bonding module 4 in the present embodiment includes a ceramic substrate 41, a plurality of circuit layers 42 formed on one side of the ceramic substrate 41, and a heat-dissipation layer 43 that is formed on another side of the ceramic substrate 41. The ceramic substrate 41 is a flat board and has a first surface 411 and a second surface 412 that is opposite to the first surface 411 and that is preferably parallel to the first surface 411, but the present disclosure is not limited thereto.

Moreover, the circuit layers 42 are stacked on the first surface 411 of the ceramic substrate 41, areas of the circuit layers 42 gradually decrease in the second direction (e.g., the downward direction shown in FIG. 3) away from the ceramic substrate 41, and thicknesses of the circuit layers 42 gradually increase in the second direction away from the ceramic substrate 41.

Specifically, the circuit layers 42 include a first circuit layer 42-1 formed on the first surface 411 of the ceramic substrate 41 in the DPC manner and a second circuit layer 42-2 that is arranged away from the ceramic substrate 41. The area of the first circuit layer 42-1 is a largest one in the areas of the circuit layers 42, and the area of the second circuit layer 42-2 is a smallest one in the areas of the circuit layers 42. The thickness of the first circuit layer 42-1 is a smallest one in the thicknesses of the circuit layers 42, and the thickness of the second circuit layer 42-2 is a largest one in the thicknesses of the circuit layers 42.

It should be noted that, as shown in FIG. 3 of the present embodiment, a quantity of the circuit layers 42 is two, and a quantity of the heat-dissipation layers 43 is one, but the present disclosure is not limited thereto. For example, as shown in FIG. 4, the circuit layers 42 include at least one third circuit layer 42-3 sandwiched between the first circuit layer 42-1 and the second circuit layer 42-2, a quantity of the heat-dissipation layers 43 can be at least two. Or, in other embodiments of the present disclosure not shown in the drawings, the sheet-like bonding module 4 can be provided without the heat-dissipation layers 43.

Moreover, the sheet-like bonding module 4 is connected to the connection pad 21 and the second connection segment 32 through the second circuit layer 42-2 so as to electrically couple the chip 2 and the lead frame 3. In the present embodiment, a connection interface between the second circuit layer 42-2 and the connection pad 21, and a connection interface between the second connection segment 32 and the second circuit layer 42-2 are each established by one of the connection bodies 5. Moreover, the at least one outside metal layer 13 is not electrically coupled to any one of the inside circuit layers 12, and the at least one heat-dissipation layer 43 is not electrically coupled to any one of the circuit layers 42.

In summary, in the wireless TO package structure 100 in the present embodiment, the second connection segment 32 and the connection pad 21 disposed on the carrying module 1 are coplanar with each other so as to enable the sheet-like bonding module 4 to replace a conventional wire-bonding process, thereby effectively increasing the performance (e.g., the heat-dissipation efficiency) and the reliability of the wireless TO package structure 100.

Moreover, each of the carrying module 1 and the sheet-like bonding module 4 is provided in a DPC configuration, and the inside metal layers 12 and the circuit layers 42 are provided in a specific stacked configuration, thereby effectively preventing a delamination issue and a warpage issue from being generated, facilitating the mass production of the wireless TO package structure 100.

The encapsulant 6 covers or encapsulates at least part of the carrying module 1, the chip 2, the first connection segment 31 and the second connection segment 32 of each of the lead frames 3, and at least part of the sheet-like bonding module 4. The pin segment 34 of each of the lead frames 3 passes through and is exposed from the encapsulant 6.

Moreover, the at least one outside metal layer 13 (e.g., the second outside metal layer 13-2) has an outside surface 13a that is arranged away from the ceramic board 11 and that is coplanar with and exposed from the encapsulant 6. The heat-dissipation layer 43 has an outer surface 43a that is arranged away from the ceramic substrate 41 and that is entirely embedded in the encapsulant 6.

Second Embodiment

Figure 6:
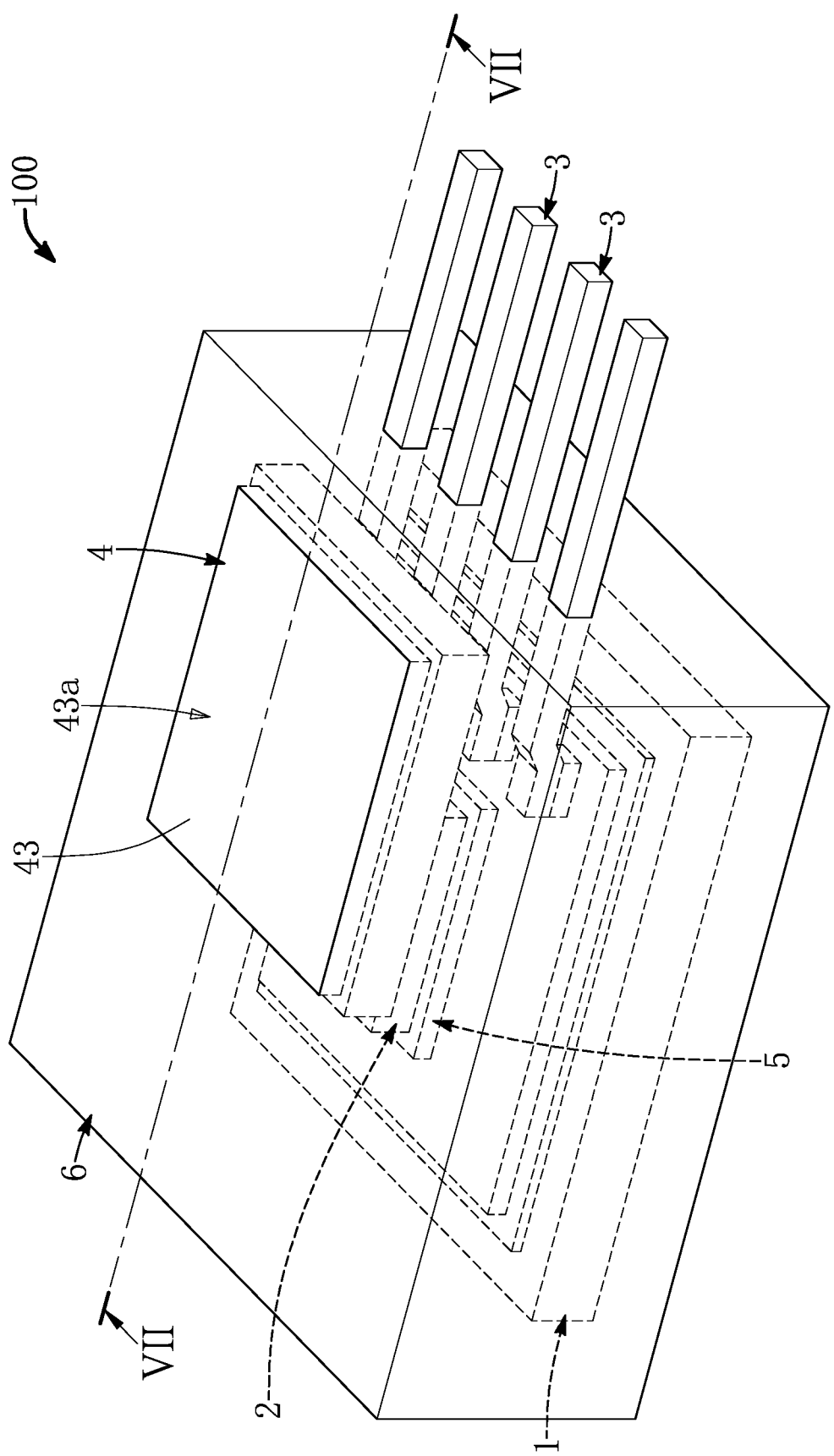
FIG. 6 is a schematic perspective view of the wireless TO package structure according to a second embodiment of the present disclosure.
Figure 7:
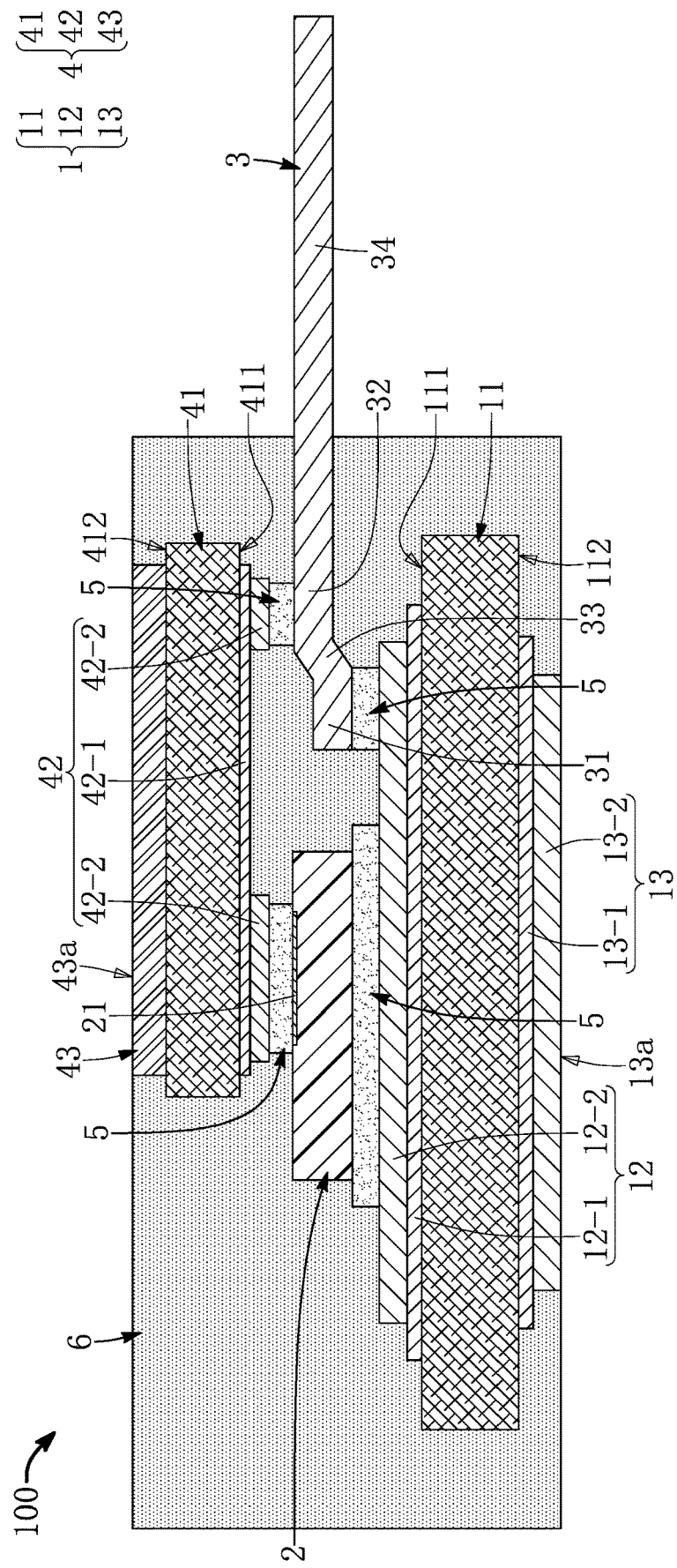
FIG. 7 is a schematic cross-sectional view taken along line VII-VII of FIG. 6.

Referring to FIG. 6 and FIG. 7, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the at least one heat-dissipation layer 43 has an outer surface 43a that is arranged away from the ceramic substrate 41 and that is coplanar with and exposed from the encapsulant 6. In other words, the outside surface 13a of the carrying module 1 is coplanar with and exposed from one side of the encapsulant 6, and the outer surface 43a of the sheet-like bonding module 4 is coplanar with and exposed from another side of the encapsulant 6.

Third Embodiment

Figure 8:
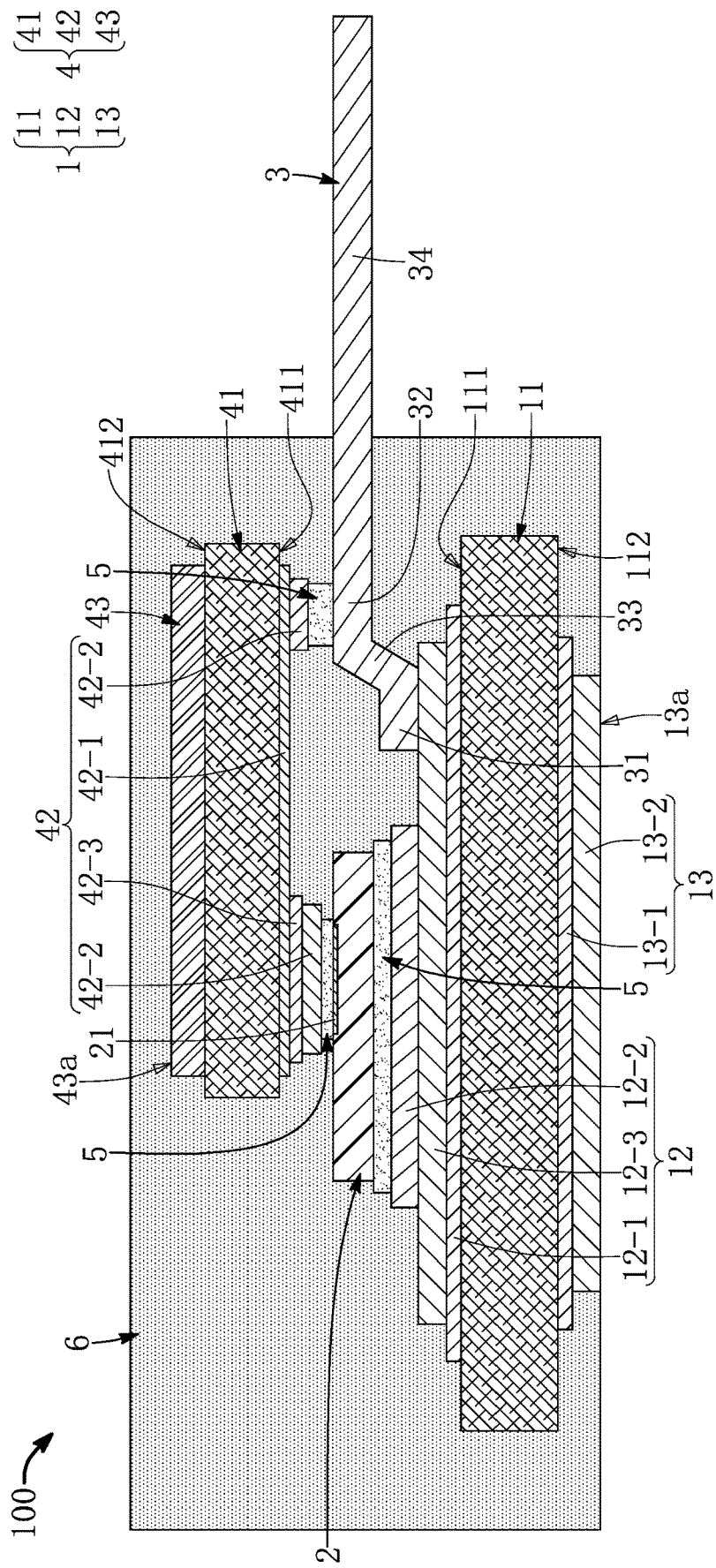
FIG. 8 is a schematic cross-sectional view of the wireless TO package structure according to a third embodiment of the present disclosure.
Figure 9:
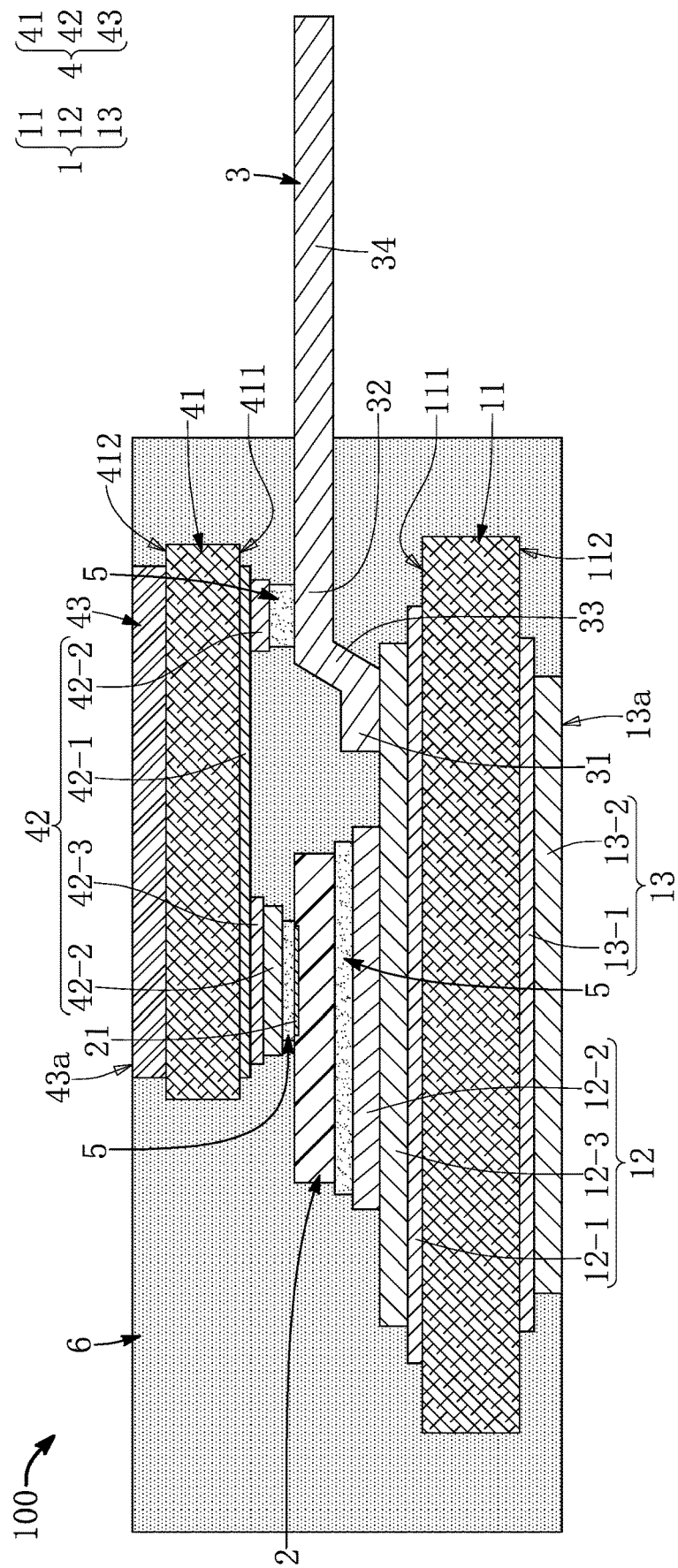
FIG. 9 is a schematic cross-sectional view showing the wireless TO package structure of FIG. 8 in another configuration.
Figure 10:
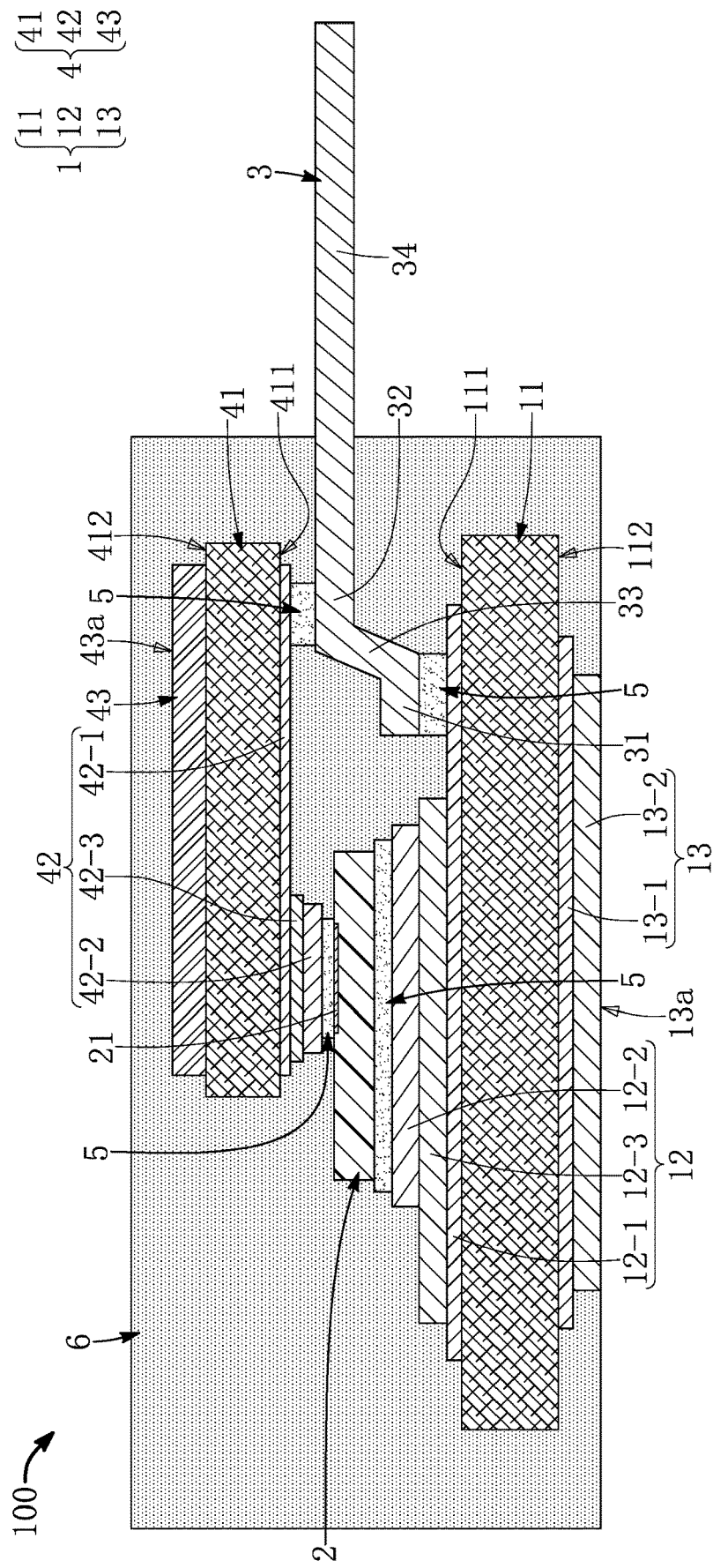
FIG. 10 is a schematic cross-sectional view showing the wireless TO package structure of FIG. 8 in yet another configuration.

Referring to FIG. 8 to FIG. 10, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the inside metal layers 12 include a first inside metal layer 12-1 formed on the inner board surface 111 of the ceramic board 11 in the DPC manner, a second inside metal layer 12-2 arranged away from the ceramic board 11, and at least one third inside metal layer 12-3 that is sandwiched between the first inside metal layer 12-1 and the second inside metal layer 12-2. Moreover, the circuit layers 42 include a first circuit layer 42-1 formed on the first surface 411 of the ceramic substrate 41 in the DPC manner, a second circuit layer 42-2 arranged away from the ceramic substrate 41, and at least one third circuit layer 42-3 that is sandwiched between the first circuit layer 42-1 and the second circuit layer 42-2.

Furthermore, the chip 2 is mounted on one of the inside metal layers 12, and the first connection segment 31 of the lead frame 3 is mounted on and electrically coupled to another one of the inside metal layers 12. The connection pad 21 of the chip 2 and the second connection segment 32 of the lead frame 3 are coplanar with each other and are connected to one of the circuit layers 42, so as to electrically couple the chip 2 and the lead frame 3.

For example, as shown in FIG. 8 and FIG. 9, the chip 2 is mounted on the second inside metal layer 12-2, the first connection segment 31 of the lead frame 3 is mounted on and electrically coupled to the at least one third inside metal layer 12-3, and the connection pad 21 and the second connection segment 32 are connected to the second circuit layer 42-2. Moreover, a connection interface between the chip 2 and the second inside metal layer 12-2, a connection interface between the second circuit layer 42-2 and the connection pad 21, and a connection interface between the second connection segment 32 and the second circuit layer 42-2 are each established by one of the connection bodies 5. Specifically, the chip 2 and the second inside metal layer 12-2 are not electrically coupled to each other through the corresponding connection body 5, and the first connection segment 31 of the lead frame 3 is directly connected to the at least one third inside metal layer 12-3 in an ultrasonic welding manner.

In addition, as shown in FIG. 10, the chip 2 is mounted on the second inside metal layer 12-2, the first connection segment 31 of the lead frame 3 is mounted on and electrically coupled to the first inside metal layer 12-1, the connection pad 21 is connected to the second circuit layer 42-2, and the second connection segment 32 is connected to the first circuit layer 42-1, thereby meeting the thickness of the chip 2 different from that shown in FIG. 8 or FIG. 9, but the present disclosure is not limited thereto.

For example, in other embodiments of the present disclosure not shown in the drawings, the chip 2 can be mounted on the first inside metal layer 12-1 or the at least one third inside metal layer 12-3, the first connection segment 31 can be mounted on and electrically coupled to the second inside metal layer 12-2, and the connection pad 21 and the second connection segment 32 are connected to the second circuit layer 42-2.

In addition, the outside surface 13*a* of the carrying module 1 is coplanar with and exposed from one side of the encapsulant 6, and the outer surface 43*a* of the sheet-like bonding module 4 is coplanar with and exposed from another side of the encapsulant 6 (as shown in FIG. 9) or is entirely embedded in the encapsulant 6 (as shown in FIG. 8), but the present disclosure is not limited thereto.

Beneficial Effects of the Embodiments

In conclusion, in the wireless TO package structure provided by the present disclosure, the second connection segment and the connection pad disposed on the carrying module are coplanar with each other so as to enable the sheet-like bonding module to replace a conventional wire-bonding process, thereby effectively increasing the performance (e.g., the heat-dissipation efficiency) and the reliability of the wireless TO package structure.

Moreover, each of the carrying module and the sheet-like bonding module is provided in a DPC configuration, and the inside metal layers and the circuit layers are provided in a specific stacked configuration, thereby effectively preventing a delamination issue and a warpage issue from being generated and facilitating the mass production of the wireless TO package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wireless transistor outline (TO) package structure, comprising:
    a carrying module including:
        a ceramic board having an inner board surface and an outer board surface that is opposite to the inner board surface; and
        a plurality of inside metal layers stacked on the inner board surface of the ceramic board, wherein the inside metal layers include a first inside metal layer formed on the inner board surface of the ceramic board in a direct plated copper (DPC) manner and a second inside metal layer that is arranged away from the ceramic board;
        wherein areas of the inside metal layers gradually decrease in a first direction away from the ceramic board, and thicknesses of the inside metal layers gradually increase in the first direction away from the ceramic board;
    a chip mounted on the second inside metal layer and having a connection pad that is arranged away from the carrying module;
    at least one lead frame having:
        a first connection segment mounted on and electrically coupled to the second inside metal layer;
        a second connection segment spaced apart from the first connection segment and being coplanar with the connection pad of the chip; and
        a pin segment extending from the second connection segment;
    a sheet-like bonding module mounted on the chip and the at least one lead frame in a flip chip manner, wherein the sheet-like bonding module includes:
        a ceramic substrate having a first surface and a second surface that is opposite to the first surface; and
        a plurality of circuit layers stacked on the first surface of the ceramic substrate, wherein the circuit layers include a first circuit layer formed on the first surface of the ceramic substrate in the DPC manner and a second circuit layer that is arranged away from the ceramic substrate, and wherein the second circuit layer is connected to the connection pad and the second connection segment so as to electrically couple the chip and the at least one lead frame;
        wherein areas of the circuit layers gradually decrease in a second direction away from the ceramic substrate, and thicknesses of the circuit layers gradually increase in the second direction away from the ceramic substrate; and
    an encapsulant encapsulating at least part of the carrying module, the chip, the first connection segment and the second connection segment of the at least one lead frame, and at least part of the sheet-like bonding module, wherein the pin segment of the at least one lead frame passes through and is exposed from the encapsulant.

2. The wireless TO package structure according to claim 1, wherein the at least one lead frame has a bending segment that slantingly connects the first connection segment and the second connection segment, such that a height of the second connection segment with respect to the inner board surface of the ceramic board is greater than a height of the first connection segment with respect to the inner board surface of the ceramic board.

3. The wireless TO package structure according to claim 1, further comprising a plurality of connection bodies, wherein a connection interface between the chip and the second inside metal layer, a connection interface between the second circuit layer and the connection pad, and a connection interface between the second connection segment and the second circuit layer are each established by one of the connection bodies, and wherein the chip and the second inside metal layer are not electrically coupled to each other through the corresponding connection body.

4. The wireless TO package structure according to claim 3, wherein each of the connection bodies is a solder, a conductive paste, a sinter silver, or a solder preform.

5. The wireless TO package structure according to claim 3, wherein the first connection segment of the at least one lead frame is directly connected to the second inside metal layer in an ultrasonic welding manner.

6. The wireless TO package structure according to claim 1, wherein the inside metal layers include at least one third inside metal layer sandwiched between the first inside metal layer and the second inside metal layer, and wherein the circuit layers include at least one third circuit layer sandwiched between the first circuit layer and the second circuit layer.

7. The wireless TO package structure according to claim 1, wherein the carrying module includes at least one outside metal layer formed on the outer board surface of the ceramic board in the DPC manner, and wherein the at least one outside metal layer has an outside surface that is arranged away from the ceramic board and that is coplanar with and exposed from the encapsulant.

8. The wireless TO package structure according to claim 7, wherein the sheet-like bonding module includes at least one heat-dissipation layer that is formed on the second surface of the ceramic substrate in the DPC manner and that is entirely embedded in the encapsulant.

9. The wireless TO package structure according to claim 7, wherein the sheet-like bonding module includes at least one heat-dissipation layer formed on the second surface of the ceramic substrate in the DPC manner, and wherein the at least one heat-dissipation layer has an outer surface that is arranged away from the ceramic substrate and that is coplanar with and exposed from the encapsulant.

10. The wireless TO package structure according to claim 9, wherein the at least one outside metal layer is not electrically coupled to any one of the inside metal layers, and the at least one heat-dissipation layer is not electrically coupled to any one of the circuit layers.

11. A wireless transistor outline (TO) package structure, comprising:
   a carrying module including:
      a ceramic board having an inner board surface and an outer board surface that is opposite to the inner board surface; and
      a plurality of inside metal layers stacked on the inner board surface of the ceramic board, wherein the inside metal layers include a first inside metal layer formed on the inner board surface of the ceramic board in a direct plated copper (DPC) manner, a second inside metal layer arranged away from the ceramic board, and at least one third inside metal layer that is sandwiched between the first inside metal layer and the second inside metal layer;
      wherein areas of the inside metal layers gradually decrease in a first direction away from the ceramic board, and thicknesses of the inside metal layers gradually increase in the first direction away from the ceramic board;
   a chip mounted on one of the inside metal layers and having a connection pad that is arranged away from the carrying module;
   at least one lead frame having:
      a first connection segment mounted on and electrically coupled to another one of the inside metal layers;
      a second connection segment spaced apart from the first connection segment and being coplanar with the connection pad of the chip; and
      a pin segment extending from the second connection segment;
   a sheet-like bonding module mounted on the chip and the at least one lead frame in a flip chip manner, wherein the sheet-like bonding module includes:
      a ceramic substrate having a first surface and a second surface that is opposite to the first surface; and
      a plurality of circuit layers stacked on the first surface of the ceramic substrate, wherein the circuit layers include a first circuit layer formed on the first surface of the ceramic substrate in the DPC manner, a second circuit layer arranged away from the ceramic substrate, and at least one third circuit layer that is sandwiched between the first circuit layer and the second circuit layer, and wherein the connection pad and the second connection segment are connected to one of the circuit layers so as to electrically couple the chip and the at least one lead frame;
      wherein areas of the circuit layers gradually decrease in a second direction away from the ceramic substrate, and thicknesses of the circuit layers gradually increase in the second direction away from the ceramic substrate; and
   an encapsulant encapsulating at least part of the carrying module, the chip, the first connection segment and the second connection segment of the at least one lead frame, and at least part of the sheet-like bonding module, wherein the pin segment of the at least one lead frame pass through and is exposed from the encapsulant.

12. The wireless TO package structure according to claim 11, wherein the chip is mounted on the second inside metal layer, the first connection segment is mounted on and electrically coupled to the at least one third inside metal layer, and the connection pad and the second connection pad are connected to the second circuit layer.

13. The wireless TO package structure according to claim 12, wherein the at least one lead frame has a bending segment that slantingly connects the first connection segment and the second connection segment, such that a height of the second connection segment with respect to the inner board surface of the ceramic board is greater than a height of the first connection segment with respect to the inner board surface of the ceramic board.

14. The wireless TO package structure according to claim 12, further comprising a plurality of connection bodies, wherein a connection interface between the chip and the second inside metal layer, a connection interface between the second circuit layer and the connection pad, and a connection interface between the second connection segment and the second circuit layer are each established by one of the connection bodies, and wherein the chip and the second inside metal layer are not electrically coupled to each other through the corresponding connection body, and the first connection segment of the at least one lead frame is directly connected to the at least one third inside metal layer in an ultrasonic welding manner.

15. The wireless TO package structure according to claim 12, wherein the carrying module includes at least one outside metal layer formed on the outer board surface of the ceramic board in the DPC manner, wherein the at least one outside metal layer has an outside surface that is arranged away from the ceramic board and that is coplanar with and exposed from the encapsulant, and wherein the sheet-like bonding module includes at least one heat-dissipation layer that is formed on the second surface of the ceramic substrate in the DPC manner and that is entirely embedded in the encapsulant.

\* \* \* \* \*